(12) United States Patent
Morris et al.

(10) Patent No.: US 7,405,869 B1
(45) Date of Patent: Jul. 29, 2008

(54) METHOD AND SYSTEM OF LOCAL OSCILLATOR SIGNAL GENERATION

(75) Inventors: Francis J. Morris, Dallas, TX (US); Premjeet Chahal, Gurnee, IL (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 11/743,489

(22) Filed: May 2, 2007

(51) Int. Cl.
*G02F 1/35* (2006.01)
*G01S 13/00* (2006.01)
(52) U.S. Cl. .................. 359/330; 359/332; 342/99; 342/100
(58) Field of Classification Search .............. None
See application file for complete search history.

(56) References Cited

U.S. PATENT DOCUMENTS

2004/0017833 A1* 1/2004 Cundiff et al. ............... 372/18

* cited by examiner

*Primary Examiner*—Hemang Sanghavi
(74) *Attorney, Agent, or Firm*—Baker Botts L.L.P.

(57) ABSTRACT

Methods and apparatus for local oscillator generation are provided. In a method embodiment, a method of signal processing includes splitting a signal having a first frequency into at least a first portion and a second portion. The method also includes generating a second signal having a second frequency at a predetermined frequency difference from the first frequency by optically modulating the first portion. In addition, the method includes generating a third signal having a frequency component at a frequency that is approximately the same as the predetermined frequency difference from the first frequency by combining the second portion with the second signal.

20 Claims, 1 Drawing Sheet

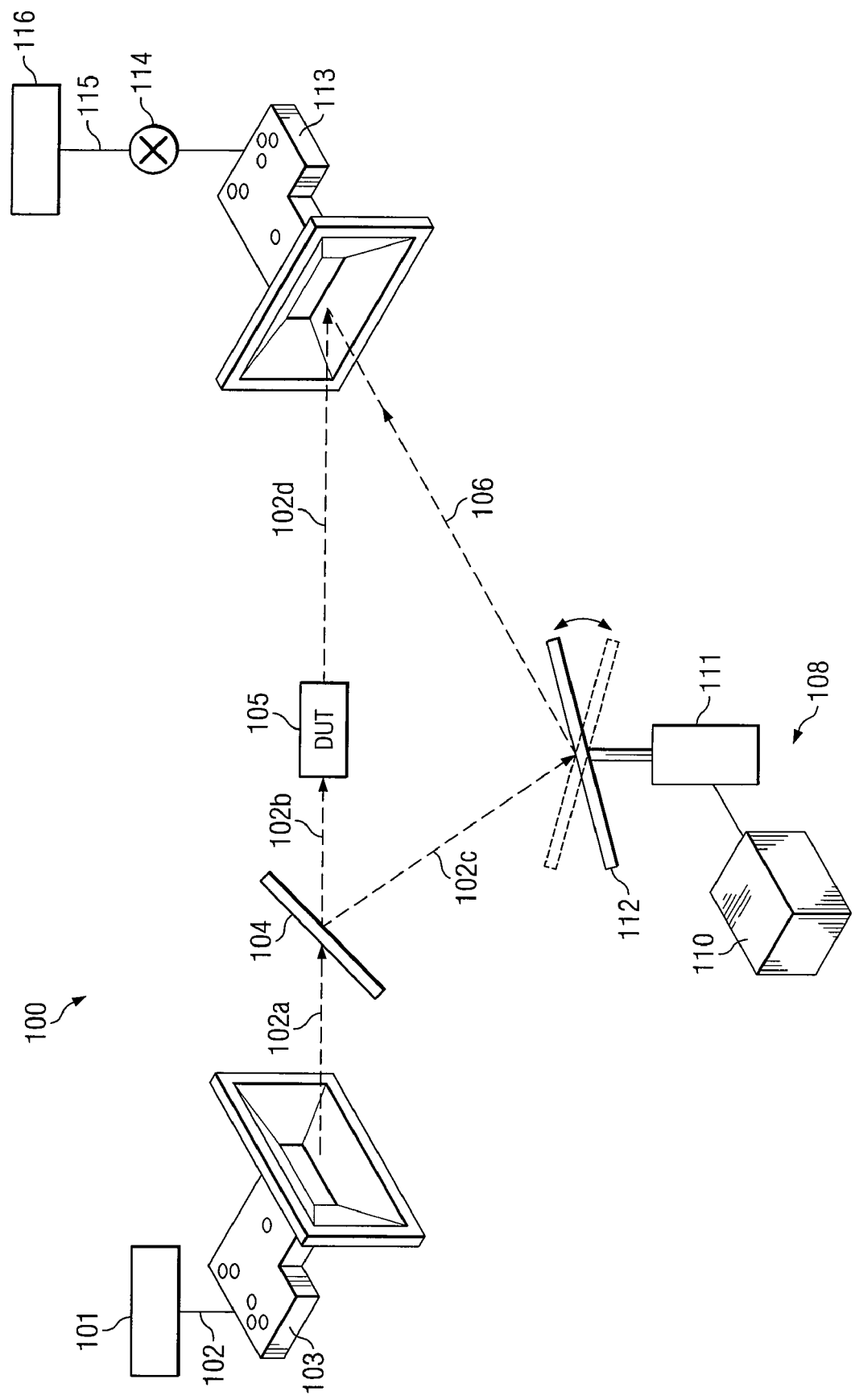

METHOD AND SYSTEM OF LOCAL OSCILLATOR SIGNAL GENERATION

TECHNICAL FIELD

This disclosure relates in general to signal processing and, in particular, to generating a local oscillator with a fixed frequency difference with respect to a varying signal frequency.

BACKGROUND

Conventional receiver systems typically down covert received signal frequencies to intermediate frequencies for signal processing purposes. Some receiver systems that receive signal frequencies over a wide range require very large intermediate frequency bandwidths. For example, in some sub-millimeter wave spectroscopy systems the intermediate frequency can vary over hundreds of gigahertz. Increasing the bandwidth of the intermediate frequency stages to handle all possible incoming signals may decrease the signal-to-noise ratio of the receiver system. Conventional approaches to keeping a constant intermediate frequency with a minimum bandwidth are limited for a variety of reasons.

SUMMARY OF THE EXAMPLE EMBODIMENTS

In a method embodiment, a method of signal processing includes splitting a signal having a first frequency into at least a first portion and a second portion. The method also includes generating a second signal having a second frequency at a predetermined frequency difference from the first frequency by optically modulating the first portion. In addition, the method includes generating a third signal having a frequency component at a frequency that is approximately the same as the predetermined frequency difference from the first frequency by combining the second portion with the second signal.

Technical advantages of some embodiments of the disclosure may include efficient methods and systems for converting virtually any signal frequency, including, for example, those that may vary over hundreds of gigahertz. Some embodiments may include design simplification and cost reductions associated with a single signal source compared to multiple signal sources used in conventional heterodyning approaches. Additionally, various embodiments may improve signal-to-noise ratios while providing a highly selectable and adaptable intermediate frequency bandwidth.

It will be understood that the various embodiments of the present disclosure may include some, all, or none of the enumerated technical advantages. In addition other technical advantages of the present disclosure may be readily apparent to one skilled in the art from the figures, description, and claims included herein.

BRIEF DESCRIPTION OF THE DRAWINGS

For a more complete understanding of the present disclosure and features and advantages thereof, reference is now made to the following description, taken in conjunction with the accompanying drawings, in which:

FIG. 1 is a block diagram of a portion of a receiver system according to one embodiment of the present disclosure.

DESCRIPTION OF EXAMPLE EMBODIMENTS

According to the teachings of the present disclosure, methods and apparatus for local oscillator generation are provided. Various embodiments may convert a variable source signal to a particular converted frequency by using the Doppler Effect to generate a local oscillator having a fixed frequency difference from the source signal. Particular examples specified throughout this document are intended for example purposes only, and are not intended to limit the scope of the present disclosure. In particular, this document is not intended to be limited to a particular system, such as, a sub-millimeter wave spectroscopy system.

FIG. 1 is a block diagram of a portion of a frequency converter system 100 according to one embodiment of the present disclosure. In the example embodiment, system 100 is generally capable of converting the frequency of a source signal 102 by using the Doppler Effect to generate a local oscillator having a fixed frequency difference from the source signal 102.

In the example embodiment, a microwave transmitter 101 communicates source signal 102 to a horn or antenna 103. Source signal 102 may also pass through an amplification stage (not explicitly shown) between microwave transmitter 101 and horn or antenna 103. Source signal 102 may be, for example, an amplitude modulated signal with a signal at the carrier frequency as well as the upper and lower sideband frequencies. In various embodiments, source signal 102 may vary over any suitable bandwidth including, for example, hundreds of gigahertz.

Horn or antenna 103 generally refers to any device operable to radiate at least a portion 102a of source signal 102. In the example embodiment, radiated portion 102a is split into two beams 102b and 102c by a beam splitter 103. In the example embodiment, radiated beam 102b is directed toward a device under test (DUT) 105, as explained further below; however, other embodiments may not include DUT 105. Radiated beam 102c is directed towards a Doppler shifter 108.

Doppler shifter 108 generally refers to any device capable of using the Doppler Effect, as explained further below, to modulate radiated beam 102c. In the example embodiment, Doppler shifter 108 includes a controller 110 operable to send a control signal to a traducer 111 that controls the vibration frequency of a moveable mirror 112; however, alternative Doppler shifter 108 components may be used, such as, for example ferroelectric waveguides, or other suitable components.

In the example embodiment, as radiated beam 102c impinges on vibrating mirror 112, the beam reflection will have a signal at the carrier frequency of beam 102c as well as Doppler shifted frequency components, thereby generating local oscillator signal 106. The Doppler shifted frequency components are shifted from the carrier frequency of radiated beam 102c by $\pm f_m$ where $f_m$ is the vibration frequency of mirror 112. In this manner, local oscillator signal 106 has frequency components at fixed frequency difference from source signal 102 equivalent to the vibration frequency of mirror 113. Local oscillator signal 106 is captured by horn or antenna 113.

Horn or antenna 113 generally refers to any device operable to capture radiated beams, such as a radiated beam 102d, outputted from DUT 105, and local oscillator signal 106. In the example embodiment, radiated beam 102d has the same frequency and amplitude components as source signal 102. Horn or antenna 113 is communicatively coupled to a mixer 114."

Mixer 114 generally refers to any device operable to mix or combine radiated beam 102d and local oscillator signal 106, communicated by horn or antenna 113, to output a converted signal 115. Mixer 114 may mix or combine signals, for example, by multiplying the signals together. In the example embodiment, local oscillator signal 106 has frequency components at a fixed frequency difference $\pm f_m$ from the frequency of radiated beam 102d. Thus, the combination of radiated beam 102d and local oscillator signal 106 results in a converted signal 115 having a converted frequency component at the same frequency $f_m$ as the vibration frequency of mirror 112. In this manner, the $f_m$ frequency component of converted signal 115 is essentially independent of the source signal 102 frequency, even though source signal 102 may vary over an extremely wide bandwidth. The converted signal 115 outputted from mixer 114 is communicated to an amplifier 116.

In the example embodiment, amplifier 116 has a center frequency corresponding to the $f_m$ frequency component of converted signal 115. That is, the center frequency of amplifier 116 is equal to the vibration frequency of mirror 112. In this manner, amplifier 116 may have an amplification stage with a very narrow band intermediate frequency, thereby potentially reducing noise and enhancing signal-to-noise ratios. In various embodiments, the output of amplifier 116 can be amplified further by using the control signal from controller 110 to phase lock a Lock-in amplifier for potentially higher signal-to-noise ratios.

Conventional receiver systems typically down covert received signal frequencies to intermediate frequencies for signal processing purposes. One conventional approach to keeping a constant intermediate frequency with a minimum bandwidth is to adjust a local oscillator to maintain a constant frequency difference with the incoming signal. For example, below about 1 GHz, two digital synthesizers, dedicated respectively to the received signal and a local oscillator, can each be programmed to maintain a constant frequency difference as the incoming signal varies. At frequencies above X-band, however, multiple tracking sources typically are cost prohibitive. Another conventional approach is to mix, by means of non-linear signal processing, a variable frequency local oscillator signal with the received incoming signal to create a third signal having a frequency within a workable bandwidth. This latter approach is straightforward at relatively low frequencies, but it becomes increasingly difficult to fabricate efficient wide band mixers and tracking local oscillators at frequencies above 100 GHz.

Accordingly, teachings of the present disclosure recognize methods and systems for converting a variable source frequency to a particular intermediate frequency by using the Doppler Effect to generate a local oscillator having a fixed frequency difference from the source. Various embodiments may efficiently convert virtually any source frequency, including, for example, those that may vary over hundreds of gigahertz. Some embodiments may include only a single source signal, thereby simplifying design and reducing costs compared to conventional heterodyning approaches. Additionally, various embodiments may improve signal-to-noise ratios over conventional designs while providing a highly selectable and adaptable intermediate frequency bandwidth.

Spectroscopy systems, in which the center frequency can often vary over hundreds of gigahertz, are one example application that may use the teachings of the present disclosure. For example, device under test 105 of FIG. 1 may be a spectroscopic device operable to receive radiated beam 102b and output radiated beam 102d.

In the example embodiment, system 100 applies the Doppler Effect in a quasi-optical, sinusoidal manner to generate a local oscillator signal 106 having a fixed frequency difference with respect to a wideband, frequency-varying source signal 102. For illustrative purposes, a brief and general description of some equations associated with the Doppler Effect are provided below.

The Doppler Effect, first explained in 1842 by Christian Doppler, is the shift in frequency and wavelength of waves that results from a source moving with respect to the medium, a receiver moving with respect to the medium, or even a moving medium.

The detected frequency (f') is related to the incoming frequency ($f_i$) and the relative speeds of the source ($v_s$), speed of the observer ($v_o$), and the speed (c) of light in the medium by $$f' = fi\left(\frac{c \pm v_o}{c \pm v_s}\right)$$

The choice of using the plus (+) or minus (−) sign is made according to the convention that if the source and observer are moving towards each other the perceived frequency (f') is higher than the incoming frequency ($f_i$). Likewise, if the source and observer are moving away from each other the perceived frequency (f') is lower than the source frequency.

In the example embodiment of FIG. 1, moving mirror 112 is the source for the reflected wave and the horn or antenna 113 is the fixed observer. Under these conditions, the above expression can be simplified to $$f' = fi\left(1 \mp \frac{v_s}{c}\right)$$

The motion of mirror 112 modulates the frequency of the signal detected by horn or antenna 113. Assuming a simple harmonic motion of mirror 112, mirror 112 location is given by: $\chi = \chi_m \sin(\omega_m t) + \chi_o$ where $\chi_m$ is peak displacement of mirror 112 which is vibrating about $\chi_o$ at a frequency $\omega_m$. Differentiating the above expression yields the velocity of mirror 112 as given by $$U_s = \omega_m * \chi_m \cos(\omega_m t)$$

which results in a signal frequency at horn or antenna 113 given by $$f' = fi\left(1 \mp \frac{w_m x_m \cos(w_m t)}{c}\right)$$

The general equation of a radio frequency ("RF") signal seen by horn or antenna 113 can be expressed as $$\epsilon = A \sin \phi(t)$$

where A=signal peak amplitude and $\phi(t)$ is the total angular displacement as a function of time and is given by $$\varphi(t) = \int 2\pi f'(\tau) d\tau + \Phi_o$$

$$= \int 2\pi fi\left(1 \mp \frac{w_m x_m \cos(w_m t)}{c}\right) dt + \Phi_o$$

-continued $$= w_i\left(1 \mp \frac{x_m \sin(w_m t)}{c}\right)t + \Phi o \text{ where } w_i = 2\pi fi$$

Substituting this expression for φ(t) into the expression for the RF signal seen by the horn or antenna 113 yields:

$$\varepsilon(t) = A\sin\left(w_i\left(1 \mp \frac{x_m \sin(w_m t)}{c}\right)t + \Phi o\right)$$

This expression is similar to that obtained for typical frequency modulated signal with an apparent modulation index given by ($w_o x_m/c$). For the case where $w_o x_m/c \ll 1$ this expression can be approximated by $$\varepsilon(t) =$$
$$A\cos(w_i t) - 1/2A\left(\frac{x_m w_i \cos((w_i - w_m)t)}{c}\right)t + 1/2A\left(\frac{x_m w_i \cos((w_i - w_m)t)}{c}\right)$$

This expanded expression is similar to a typical amplitude modulated signal with a signal at the carrier frequency as well as Doppler shifted frequency components. The Doppler shifted frequency components are shifted from the incident frequency by ±$f_m$ where $f_m$ is the vibration frequency of mirror 112. If this reflected signal is mixed with the incident signal, the resulting mixed signal will have a converted frequency component at the mirror 112 vibration frequency. In the example embodiment, this converted frequency component carries the amplitude modulation of the incident signal, resulting in a very narrow band intermediate frequency amplifier stage for low noise and high signal-to-noise ratios. Various embodiments may significantly convert the incident frequency. For example, in some embodiments, the incident frequency may be more than an order of magnitude greater than the converted frequency component at the mirror 112 vibration frequency.

Although the example embodiment assumes a simple sinusoidal vibration of mirror 112, various other embodiments may use other modes of vibration having waveforms that are more complex. Some such embodiments may still generate a local oscillator signal 106 that maintains a fixed offset frequency as the frequency of source signal 102 is varied.

Although the present disclosure has been described in several embodiments, a myriad of changes, variations, alterations, transformations, and modifications may be suggested to one skilled in the art, and it is intended that the present disclosure encompass such changes, variations, alterations, transformations, and modifications as falling within the spirit and scope of the appended claims.

What is claimed is:

1. A method of signal processing, comprising:
    splitting a signal having a first frequency into at least a first portion and a second portion;
    vibrating a mirror at a second frequency, the second frequency at least an order of magnitude less than the first frequency;
    generating a local oscillator signal by impinging the first portion on the vibrating mirror;
    generating a converted frequency signal having a frequency component at approximately the second frequency by multiplying the second portion with the local oscillator signal; and
    receiving the converted frequency signal at a receiver tuned to approximately the second frequency.

2. The method of claim 1, wherein the first frequency is greater than approximately 100 gigahertz.

3. The method of claim 1, wherein the receiver is an amplifier.

4. The method of claim 1, and further comprising receiving the second portion at a device under test.

5. A method of signal processing;
    splitting a signal having a first frequency into at least a first portion and a second portion;
    generating a second signal having a second frequency at a predetermined frequency difference from the first frequency by optically modulating the first portion; and
    generating a third signal having a frequency component at a frequency that is approximately the same as the predetermined frequency difference from the first frequency by combining the second portion with the second signal.

6. The method of claim 5, wherein optically modulating the first portion comprises impinging the first portion on a moving mirror.

7. The method of claim 6, and further comprising vibrating the moving mirror at a frequency approximately the same as the predetermined frequency difference from the first frequency.

8. The method of claim 5, wherein optically modulating the first portion comprises transmitting the first portion through one or more ferroelectric waveguides.

9. The method of claim 5, wherein the first frequency is at least an order of magnitude greater than the predetermined frequency difference from the first frequency.

10. The method of claim 5, wherein the first frequency is greater than approximately 100 gigahertz.

11. The method of claim 5, and further comprising receiving the third signal at a receiver tuned to approximately the predetermined frequency difference from the first frequency.

12. The method of claim 5, and further comprising receiving the second portion at a device under test.

13. A signal processing system, comprising:
    a beam splitter operable to split a signal comprising a first frequency into at least a first portion and a second portion, the first portion radiated along a first signal path;
    a local oscillator operable to generate, by optically modulating the first portion, a second signal having a second frequency at a predetermined frequency difference from the first frequency; and
    a mixer operable to combine the second signal and the second portion to generate a third signal having a frequency component at approximately the same frequency as the predetermined difference from the first frequency.

14. The signal processing system of claim 13, wherein the local oscillator comprises a moveable mirror.

15. The signal processing system of claim 14, wherein the moveable mirror is operable to vibrate at a frequency approximately the same as the predetermined frequency difference from the first frequency.

16. The signal processing system of claim 15, and further comprising:
    a mirror driver operable to provide a control signal that controls the vibration of the moveable mirror; and
    an amplifier communicatively coupled to the mixer and tuned to approximately the predetermined frequency difference from the first frequency, the amplifier phase locked to the control signal.

17. The signal processing system of claim 13, wherein the local oscillator comprises one or more ferroelectric waveguides.

18. The signal processing system of claim 13, wherein the first frequency is greater than approximately 100 gigahertz.

19. The signal processing system of claim 13, and further comprising an amplifier communicatively coupled to the mixer and tuned to approximately the predetermined frequency difference from the first frequency.

20. The signal processing system of claim 13, and further comprising a device under test operable to:

receive the second signal;

measure a first component as a function of the second portion; and transmit the second portion.

* * * * *

UNITED STATES PATENT AND TRADEMARK OFFICE
CERTIFICATE OF CORRECTION

PATENT NO. : 7,405,869 B1
APPLICATION NO. : 11/743489
DATED : July 29, 2008
INVENTOR(S) : Francis J. Morris et al.

It is certified that error appears in the above-identified patent and that said Letters Patent is hereby corrected as shown below:

<u>Column 5, Line 21:</u>
Delete $$ \text{``} \varepsilon(t) = A\cos(w_i t) - 1/2A\left(\frac{x_m w_i \cos((w_i - w_m)t)}{c}\right)t + 1/2A\left(\frac{x_m w_i \cos((w_i. - w_m)t)}{c}\right) \text{''} $$

and insert $$ -- \varepsilon(t) = A\cos(w_i t) - 1/2A\left(\frac{x_m w_i \cos((w_i - w_m)t)}{c}\right)t + 1/2A\left(\frac{x_m w_i \cos((w_i + w_m)t)}{c}\right) --. $$

Signed and Sealed this

Thirtieth Day of December, 2008

JON W. DUDAS
*Director of the United States Patent and Trademark Office*